United States Patent [19]
Hemstreet

[11] 3,963,353
[45] June 15, 1976

[54] MONOLITHIC BEAM SPLITTER MIRROR ARRANGEMENT

[75] Inventor: Harold S. Hemstreet, Wilton, Conn.

[73] Assignee: The Perkin-Elmer Corporation, Norwalk, Conn.

[22] Filed: Sept. 26, 1974

[21] Appl. No.: 509,588

[52] U.S. Cl............................ 356/168; 356/172; 350/30; 350/169
[51] Int. Cl.² ................. G01B 11/24; G02B 27/10
[58] Field of Search ........... 356/165, 166, 168, 172; 350/30, 173, 174, 169, 172, 286, 55, 27

[56] References Cited
UNITED STATES PATENTS

| | | | |
|---|---|---|---|
| 2,765,704 | 10/1956 | Mottu | 356/166 |
| 3,718,396 | 2/1973 | Hennings | 356/172 |

Primary Examiner—John K. Corbin
Assistant Examiner—Jon W. Henry
Attorney, Agent, or Firm—S. A. Giarratana; F. L. Masselle

[57] ABSTRACT

A beam splitter is incorporated as one of the mirrors in a three mirror folding array in a projection system for exposing wafers used in making micro circuits. Through the use of the beam splitter, it is possible to view the wafer for alignment purposes while avoiding the drawbacks of viewing through the back of the master which is being imaged on the wafer.

4 Claims, 1 Drawing Figure

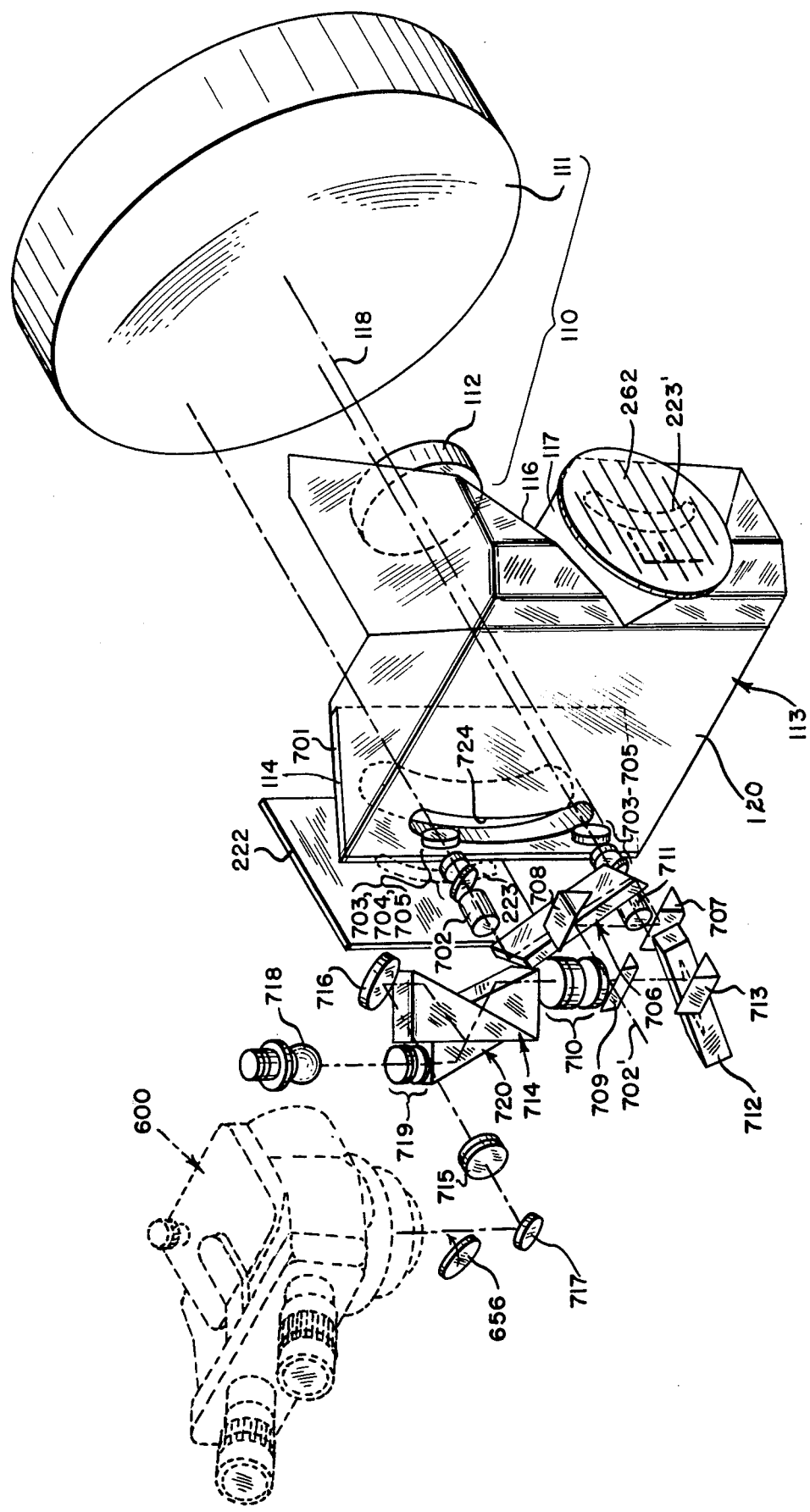

MONOLITHIC BEAM SPLITTER MIRROR ARRANGEMENT

BACKGROUND OF THE INVENTION

This invention relates to optical systems in general, and more particularly to an improved arrangement in an optical system which permits viewing an image projected on a wafer or the like without the drawbacks of viewing through the back of the master.

In a copending application of H. S. Hemstreet et al., Ser. No. 339,860, filed Mar. 9, 1973 and assigned to the same assignee as the present invention, an optical projection and scanning apparatus for the manufacture of integrated circuits is disclosed. In the disclosed projection apparatus alignment between a mask or master and a wafer is required prior to scanning the mask to expose the wafer. Viewing systems for accomplishing such alignments are disclosed in that application and various specialized features and aspects thereof are also described in an application of D. A. Markle et al. entitled "Coarse Viewing System", Ser. No. 509,597 and an application of W. H. Newell entitled "Viewing Field Splitter", Ser. No. 509,587, both of which were filed on even date herewith and are assigned to the same assignee as the present invention.

One of the other features of that system is a mirror array having three reflecting surfaces arranged to form three mutually perpendicular mirrors to permit scanning the mask and wafer together and to result in an exposure equivalent to that of a contact print. This arrangement is also disclosed in the aforementioned application Ser. No. 339,860 and is furthermore disclosed and claimed in an application of D. A. Markle, Ser. No. 509,598, filed on even date herewith and assigned to the assignee as the present invention.

The most obvious method of viewing the wafer and the image thereon would be through the back of the master. However, such viewing suffers from various disadvantages. Among these are the incapability of viewing all of the image surface where the object is opaque, or mainly so, and the incapability of viewing the image plane in one color and the object imaged on the image plane in another color.

In view of these drawbacks, the need for an improved arrangement to permit viewing all image surfaces and to enable viewing the image plane in one color and the object imaged on the image plane in different color is evident.

SUMMARY OF THE INVENTION

The present invention avoids these disadvantages by the incorporation as one of the mirrors in the three-fold mirror array disclosed and claimed in the aforementioned D. A. Markle application Ser. No. 509,598, of a beam splitter which provides a simple convenient means of obtaining light for viewing the alignment between the object and image in a projection copying system such as that of application Ser. No. 339,860. The beam splitter permits viewing such alignment without viewing through the back of the master; consequently, it enables viewing all of the image surface even if the master is opaque, or primarily so, and also permits the viewing of the image plane in one color and the object imaged thereon in another, distinguishing color.

In the preferred embodiment, the mirror surfaces are formed in a single assembly, i.e., a single piece of glass. The beam-splitting mirror overlies one side of this single piece of glass fastened thereto by cementing or the like. Behind the mirror, the glass contains a cutout in an arcuate shape corresponding to the arcuate image which is formed on the wafer by the illumination system of the scanning apparatus.

BRIEF DESCRIPTION OF THE DRAWINGS

The single FIGURE is a perspective view of the incorporation of the beam splitter of the present invention in an optical projection and scanning apparatus.

DETAILED DESCRIPTION OF THE PREFERRED EMBODIMENT

The single FIGURE illustrates a three mirror folding system including the beam splitter of the present invention in combination with an annular field projection system.

This system, which is more fully described in application Ser. No. 339,860, includes an illumination system for illuminating an arc 223 on a mask or master 222. The illuminated arc is imaged by means of the reflecting surface 114 of the three mirror folding array 113, the optical system 110 comprising the primary mirror 111 and secondary mirror 112, and the reflecting surfaces 116 and 117 on the other side of the three fold mirror array, onto a wafer 262. In this manner, an image 223' of arc 223 is formed on wafer 262.

In operation of this apparatus, it is necessary that the image be properly aligned with the mask. Means for coarse and fine alignment are provided but now shown in the drawing. These are more fully disclosed in the aforementioned applications of H. S. Hemstreet et al., D. A. Markel et al., and W. H. Newell. In order to make the necessary adjustments, binocular viewing means or eyepiece 600 are provided which have inputs from a coarse and fine viewing system.

As noted above, it is desired to view the wafer and the image thereon without viewing through the back of the mask or master 222. The present invention accomplishes this by employing a beam splitter 701 as the first surface encountered by the light from the illuminated arc 223 on mask 222. The face of the beam splitter 701 forms the reflecting surface 114 which reflects arc 223 as described above. However, for purposes of viewing, the image of the arc 223' and the mask 222 are viewed through the back of the beam splitter using the fine viewing system illustrated.

The image of the mask at the wafer and the wafer itself considered as objects, and more particularly the portions of those objects lying within the area 223' on the wafer, (which area is itself the image on the wafer of the illuminated area 223 on the mask), are reimaged backward successively at the reflecting faces 116, 117, mirror 112 and mirror 111 again. Selected portions of the resulting aerial image are examined with the aid of two movable microscope objectives in conjunction with eyepiece 600. However, instead of examining such an aerial image in the plane of the mask itself, there is examined the aerial image formed by the fraction of the backwardly travelling light from the mirror 111 which passes through beamsplitter 701. More particularly, two microscopes permit examination of two portions controllably spaced along the arcuate area 223' on the surface of the wafer.

For this purpose, the glass block 120 has cut therethrough an arcuate slot 724, extending substantially parallel to the axis 118 from the near face of the block in the drawing to the face of the block on which the plate 701 is affixed. The aerial image of interest of the area 223', which is arcuate in shape with its center of curvature substantially on axis 118, lies substantially in a plane perpendicular to that axis and is near the opening of aperture 724 at the near face of array 113. Two microscopes objectives 702 and 711 are provided, supported on arms (not shown) which are pivoted substantially on axis 118 and of such length as to align those objectives with arcuate slot 724. Supported with each objective 702, 711 are three plates 703, 704 and 705, suitably tilted about the axis of the objective to compensate for coma and astigmatic aberrations introduced into the image presented to that objective by the convergent passage through the tilted plate 701 of light on its way to formation of that image. Supported near the objective 702 on its arm is a periscope prism 706 to bring the axis of objective 702 down to axis 118. After two reflections in prism 706 and two further reflections at stationary path-folding mirrors 707 and 708, the image of the fraction of the image 223' at the wafer selected by objective 702 is formed in the vicinity of a further plane mirror 709. Mirror 709 selects half of this image and diverts it into one-half of the field of a field lens combination 710.

The other microscope objective 711, together with associated tilt-plates 703, 704 and 705 and periscope prism 712 movably mounted on the second arm, bring to axis 118 light representative of another selected part of the area 223'. This light is deviated at a fixed mirror 713 into the other half of the field lens combination 710.

Objectives 702 and 711 thus each contribute an image of a semi-circular area along the arcuate image 223'. The two half fields so combined are presented to the operator in eyepiece 600, after passage through an aximuthal-angle-selecting prism 714, a relay lens 715, and deviation at mirrors 716 and 717. A lamp 718 and associated lens and filter combination 719 and combining prism 720 makes it possible to illuminate the semicircular areas on the wafer, along the length of the area 223', in a visible color contrasting with that of the illumination system disclosed in connection with FIG. 5 of the aforementioned copending patent application Ser. No. 339,860.

Thus, through the inclusion of beam splitter 701, it is not necessary to view wafer 262 through the back of the mask 222. This avoids any problems which might be caused by opaque areas on the mask 222 and furthermore permits using lamp 718 to illuminate the wafer in a different color than that of the illumination system. That is, the light is transmitted through the lens and filter combination 719, through the combining prism 720 and thence through the remainder of the above disclosed optical system to the mask 222.

The reflecting face of the beam splitter 701 will preferably take the form of a dichroic coating of high reflectivity in the ultra-violet range and approximately 50 percent reflection and 50 percent transmission in the visible range. Beam splitter 701 has this surface on a thin glass plate affixed to block 120 of mirror array 113 by gluing or other well known techniques.

What is claimed is:

1. In an optical projection system wherein the image of a preselected portion on a master is projected onto a wafer, the projection system including, between the master and the wafer, a plurality of reflective surfaces angularly disposed for folding the optical path of the system, an improved arrangement for viewing the image projected on the wafer comprising:

said reflective surfaces being provided respectively by different reflective faces of a single monolithic structure, said structure having an aperture therethrough opening through one of said faces, the reflective surface of said one face being provided by a beam splitting plate on the one face and over the opening of said aperture therethrough, said aperture being aligned for the portion of reimaging light that is reflected back through the system from the wafer and that passes through said beam splitting plate to pass through said structure, optical correcting means in the path of the portion of reimaging light that passes through said aperture to compensate for distortion introduced in the latter portion of reimaging light by the angle at which this light passes through said beam splitting plate, and objective lens means and viewing means in the path of light emerging through the optical correcting means for viewing the composite reimage of said portion of the master and the portion of the wafer on which the image of said portion of the master is projected.

2. The arrangement of claim 1 includes lamp means for directing illumination into the optical system through said aperture said lamp providing illumination of a color different from illumination utilized in the optical system for projecting the image of the master onto the wafer.

3. The arrangement of claim 1 including at least two objective lens means in the path of said remaining light through the aperture and positioned for viewing respectively different portions of said reimage.

4. The arrangement of claim 3 including field splitting means respectively in the optical paths from said two objective lenses to the viewing means for passing only a portion of the image area observed through each of the objective lenses, and combining means for passing the latter image areas to the viewing means.

* * * * *

UNITED STATES PATENT AND TRADEMARK OFFICE
CERTIFICATE OF CORRECTION

PATENT NO. : 3,963,353
DATED : June 15, 1976
INVENTOR(S) : Harold S. Hemstreet

It is certified that error appears in the above-identified patent and that said Letters Patent are hereby corrected as shown below:

In claim 3, line 2, "remaining" should read --re-imaging--.

Signed and Sealed this

Sixth Day of September 1977

[SEAL]

Attest:

RUTH C. MASON
Attesting Officer

LUTRELLE F. PARKER
Acting Commissioner of Patents and Trademarks